United States Patent [19]
Denenberg

[11] 3,971,988
[45] July 27, 1976

[54] AM/FM RECEIVER USING SPECTRAL PARAMETER ESTIMATORS

[75] Inventor: Jeffrey Neil Denenberg, Naperville, Ill.

[73] Assignee: Bell Telephone Laboratories, Incorporated, Murray Hill, N.J.

[22] Filed: Mar. 6, 1975

[21] Appl. No.: 555,739

[52] U.S. Cl. ............................... 325/316; 325/349; 329/110
[51] Int. Cl.² ....................... H04B 1/06; H03D 3/00
[58] Field of Search .................... 325/363, 315–317, 325/473–478, 344, 345, 349, 351, 67, 65; 329/1, 110

[56] References Cited
UNITED STATES PATENTS

| | | | |
|---|---|---|---|
| 3,568,067 | 3/1971 | Williford | 329/110 |
| 3,609,555 | 9/1971 | Van Blerkom | 325/349 |
| 3,665,507 | 5/1972 | Peil | 325/315 |
| 3,854,099 | 12/1974 | Kratt | 329/110 |

OTHER PUBLICATIONS

P. Bello, Some Techniques for the Instantaneous Real-Time Means, etc., IEEE Trans. on Comm. Tech., vol. 3, No. 3, pp. 285–292.

J. Denenberg, The Estimation of Spectral Moments, Ph.D. Dissertation, Illinois Inst. of Tech.

*Primary Examiner*—George H. Libman
*Attorney, Agent, or Firm*—J. C. Albrecht

[57] ABSTRACT

An AM/FM receiver which demodulates radio signals by computing estimates of spectral parameters of the radio signals. Three spectral parameter estimation circuits are selectively formed from a number of shared circuits according to the type of modulation of the radio signal. In the case of frequency modulated signals, the respective strengths of the desired signal and interfering signals dictate the most favorable circuit configuration. The first estimation circuit calculates the instantaneous amplitude of the radio signal which corresponds to the modulating audio signal of an AM signal, the second estimation circuit calculates the instantaneous frequency of the radio signal which corresponds to the modulating audio signal of an FM signal, and the third estimation circuit calculates the power mean frequency of the radio signal which, when calculated over a short period of time relative to the rate of change of the FM signal, also corresponds to the modulating audio signal.

11 Claims, 6 Drawing Figures

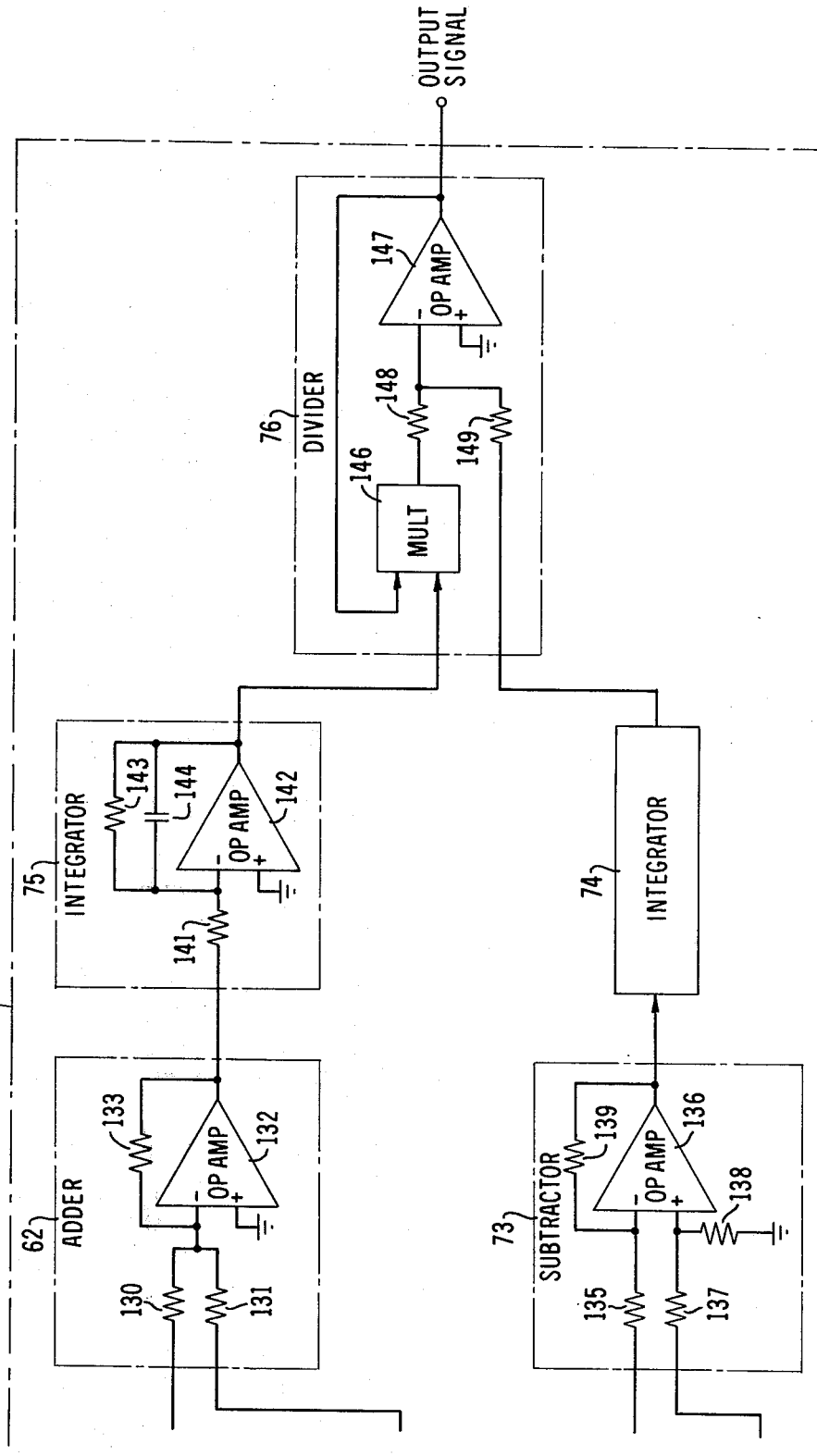

3,971,988

AM/FM RECEIVER USING SPECTRAL PARAMETER ESTIMATORS

BACKGROUND OF THE INVENTION

This invention relates to AM/FM radio receivers and to demodulating circuits for such receivers.

In a radio receiver, a detector or demodulator circuit is necessary in order to provide at its output a signal which varies according to the modulation of the radio signal. This signal may then be amplified by audio amplification circuits and used to drive some acoustic signal generating means in order to make the audio component capable of being heard by the human ear.

It is desirable to implement radio receivers using integrated circuit technology; however, most prior detectors utilize inductors which cannot be implemented using integrated circuits.

SUMMARY OF THE INVENTION

In accordance with this invention, an AM/FM receiver accomplishes demodulation of AM and FM signals through spectral parameter estimation circuits which are selectively formed from shared apparatus in accordance with the type of signal modulation and other characteristics of the received signal.

The circuit of this invention requires no inductors and may, therefore, be advantageously implemented using integrated circuit technology. This invention may also be used to perform the mixer and IF amplifier functions by connecting the output of an RF amplifier directly to the input of the invention. An integrated circuit utilizing this invention may, therefore, replace a large portion of a conventional receiver.

BRIEF DESCRIPTION OF THE DRAWING

A radio receiver circuit according to this invention will be better understood from a consideration of the detailed description of the organization and operation of one illustrative embodiment thereof which follows when taken in conjunction with the accompanying drawings in which:

FIG. 5 – 7 depict a schematic diagram of a detector according to this invention.

DETAILED DESCRIPTION

Figure 1:
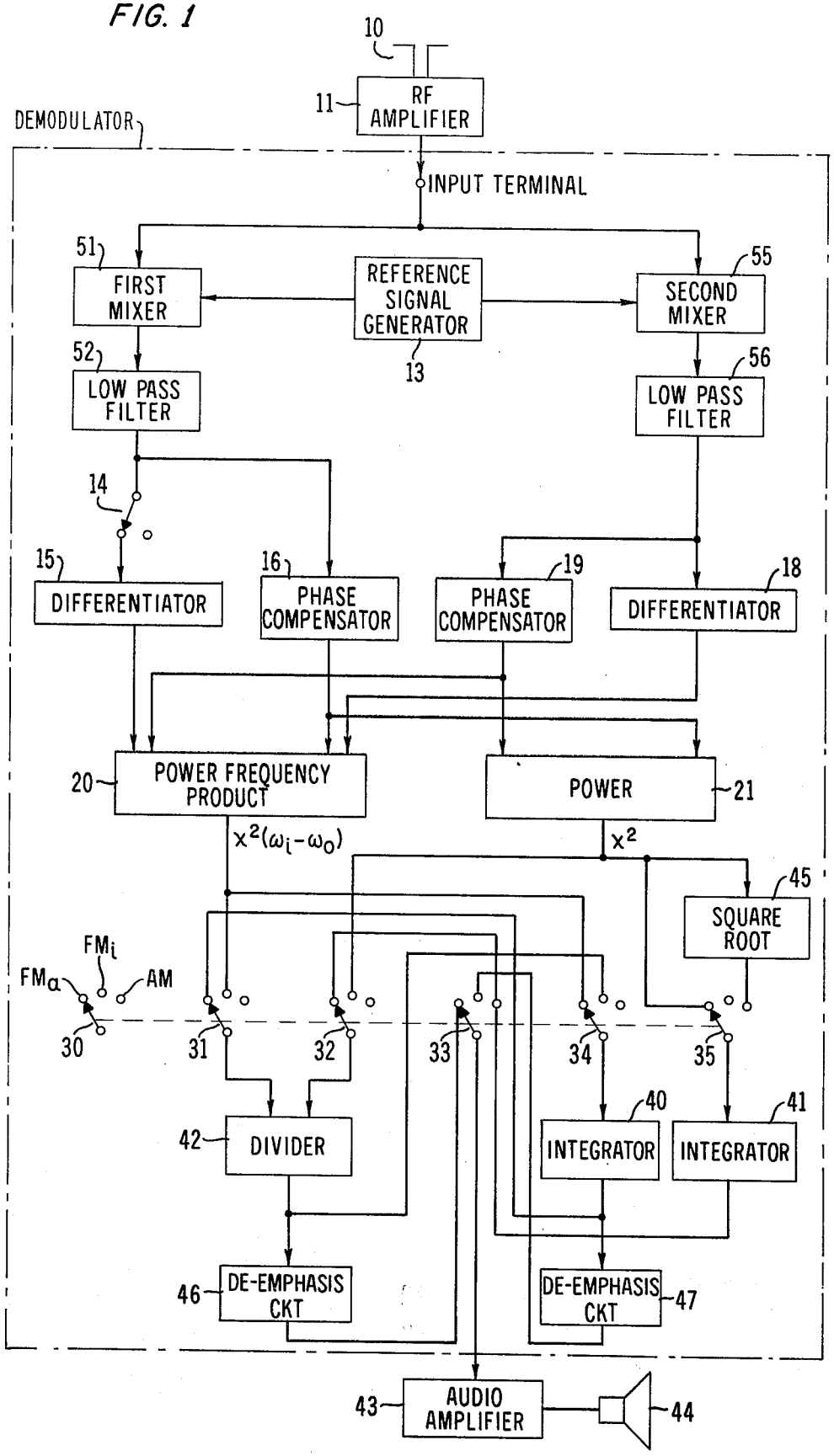
FIG. 1 depicts a block diagram of a radio receiver according to this invention.

One illustrative AM/FM receiver according to this invention is shown in FIG. 1 for generating an acoustic signal corresponding to the audio component of a radio frequency signal received on an antenna 10. The output of antenna 10 is connected to an RF amplifier 11 which amplifies the received RF signal in order to drive the remaining circuitry. The output of RF amplifier 11 is connected to an input of a first mixer circuit 51. A reference signal generator 13 generates a reference signal at a frequency $\omega_o$ and has two outputs, one for presenting an output signal corresponding to Sine $\omega_o t$ and one for presenting an output signal corresponding to Cosine $\omega_o t$. The reference frequency $\omega_o$ corresponds to the center frequency of the input signal to be demodulated and $\omega_o$ may be fixed or tunable according to the particular application of the receiver. The output signal of reference signal generator circuit 13 corresponding to Sine $\omega_o t$ is connected to an input of mixer circuit 51. The output of mixer circuit 51 is connected to the input of a low pass filter 52. The signal present on the output of low pass filter 52 corresponds to only certain low frequency components of the signal present on the input of low pass filter 52. The output of low pass filter 52 is a signal corresponding to the Sine of the difference between input signal frequency $\omega_i$ and the reference signal frequency $\omega_o$. The output of low pass filter 52 is connected to the input of an audible tuning indicator switch 14 and the output of switch 14 is connected to the input of a differentiator circuit 15. When switch 14 is in the first position, such that a closed path is present between the output of low pass filter 52 and the input of differentiator circuit 15, no tuning indication is present. When switch 14 is in the second position, such that there is no connection between the output of low pass filter 52 and the input of differentiator circuit 15, an audible tuning indicator is present in the acoustic output signal in the form of a tone whose frequency corresponds to the difference frequency $\omega_i - \omega_o$. The audible tuning indicator tone decreases in frequency as the input signal is correctly tuned in. Differentiator circuit 15 generates at its output a signal corresponding to the mathematical derivative of its input signal. Since analog differentiator circuits are inherently inaccurate in that they do not generate the same phase shift between input and output over a range of frequencies, the output of low pass filter 52 is also connected to the input of a phase compensator circuit 16 which generates an output signal corresponding to the input signal phase shifted by an amount such that the outputs of differentiator circuit 15 and phase compensator circuit 16 maintain a constant 90° phase relationship over a range of frequencies. A digital circuit implementation of the invention would not require a phase compensation circuit since a digital differentiator circuit is inherently more accurate than an analog differentiator circuit.

The output of RF amplifier 11 is also connected to a input of a second mixer circuit 55. The output of reference signal generator circuit 13 is connected to another input of mixer circuit 55. The output of mixer circuit 55 is connected to the input of a low pass filter 56. The signal present on the output of low pass filter 56 corresponds to only certain low frequency components of the signal present on the input of low pass filter 56. The output of low pass filter 56 which corresponds to the Cosine of the difference between the input signal frequency $\omega_1$ and the reference signal frequency $\omega_o$ is connected to the input of a differentiator circuit 18 which generates an output signal corresponding to the mathematical derivative of its differentiator input signal. The output of low pass filter 56 is also connected to an input of a phase compensator circuit 19 which generates an output signal corresponding to its input signal phase shifted by an amount such that the phase relationship between the outputs of phase compensator 19 and differentiator 18 remains a constant 90° over a range of frequencies.

A power frequency product circuit 20 comprises four inputs connected, respectively, to the outputs of differentiator 15, phase compensator 19, phase compensator 16, and differentiator 18, and means for generating an output signal corresponding to the product of the input signal power times the instantaneous absolute difference in frequency between the input signal frequency and the reference signal frequency.

A power circuit 21 comprises two inputs connected, respectively, to the outputs of phase compensator circuit 19 and phase compensastor circuit 16, and means for generating an output signal corresponding to the power of the input signal.

A mode selection switch 30 comprises five single-pole three-position switches which are physically coupled together. Mode switch 30 has three positions corresponding, respectively, to FM detection by means of a power frequency estimator, FM detection by means of an instantaneous frequency estimator, and AM detection by means of an instantaneous power estimator.

When mode switch 30 is in its first position, the output of power frequency product circuit 20 is connected through switch 34 to the input of an integrator circuit 40 which provides a signal at its output corresponding to the time average of its input signal over a predetermined period of time. The output of power circuit 21 is connected through switch 35 to the input of integrator circuit 41. The output of integrator circuit 40 is connected through switch 31 to the divident input of a divider circuit 42. The output of integrator circuit 41 is connected through switch 32 to the divisor input of the divider circuit 42. The output of divider circuit 42, corresponding to a quantity which represents the quantity present on the dividend input divided by the quantity present on the divisor input, is connected to the input of a de-emphasis circuit 46. The output of de-emphasis circuit 46 corresponds to the signal present on the input of circuit 46 with the high frequency components attenuated by a certain factor to compensate for the emphasis provided by the transmitter. The output of de-emphasis circuit 46 is connected to the input of an audio amplifier 43 through switch 33 which generates an output signal corresponding to the input signal amplified such that it can drive an acoustic signal generating device 44 which has its input connected to the output of the audio amplifier 43.

When mode switch 30 is in its second position the output of power frequency product circuit 20 is connected through switch 31 to the dividend input of divider circuit 42. The output of power circuit 21 is connected through switch 32 to the divisor input of divider circuit 42. The output of divider circuit 42 is connected through switch 34 to the input of integrator circuit 40. The output of integrator circuit 40 is connected through de-emphasis circuit 47 and switch 33 to the input of audio amplifier 43.

When mode switch 30 is in its third position, corresponding to AM detection, the output of power circuit 21 is connected to the input of a square root circuit 45 which generates an output signal corresponding to the mathematical square root of its input signal. The output of square root circuit 45 is connected through switch 35 to the input of integrator 41. The output of integrator 41 is connected through switch 33 to the input of audio amplifier 43.

The circuit shown in FIG. 1 may be adapted to receive stereo FM signals by techniques well known in the art, namely deleting circuits 46 and 47 and replacing circuits 43 and 44 with a stereo demodulator comprising an input connected to the output of switch 33 and an output for each of the two stereo channels. Each output of the stereo demodulator would be connected to a de-emphasis circuit followed by an audio amplifier and an acoustic signal generating device.

An AM/FM receiver such as illustrated in FIG. 1 may be implemented using either digital or analog techniques. An exemplary analog circuit implementation is shown in more detail in FIG. 2; however, the principle of the invention extends both to digital and analog implementations. A digital implementation of each of the elements of the circuit implementation described herein is fully disclosed in my application known as Denenberg 2, Ser. No. 545,410 filed on Jan. 30, 1975.

Figure 2:
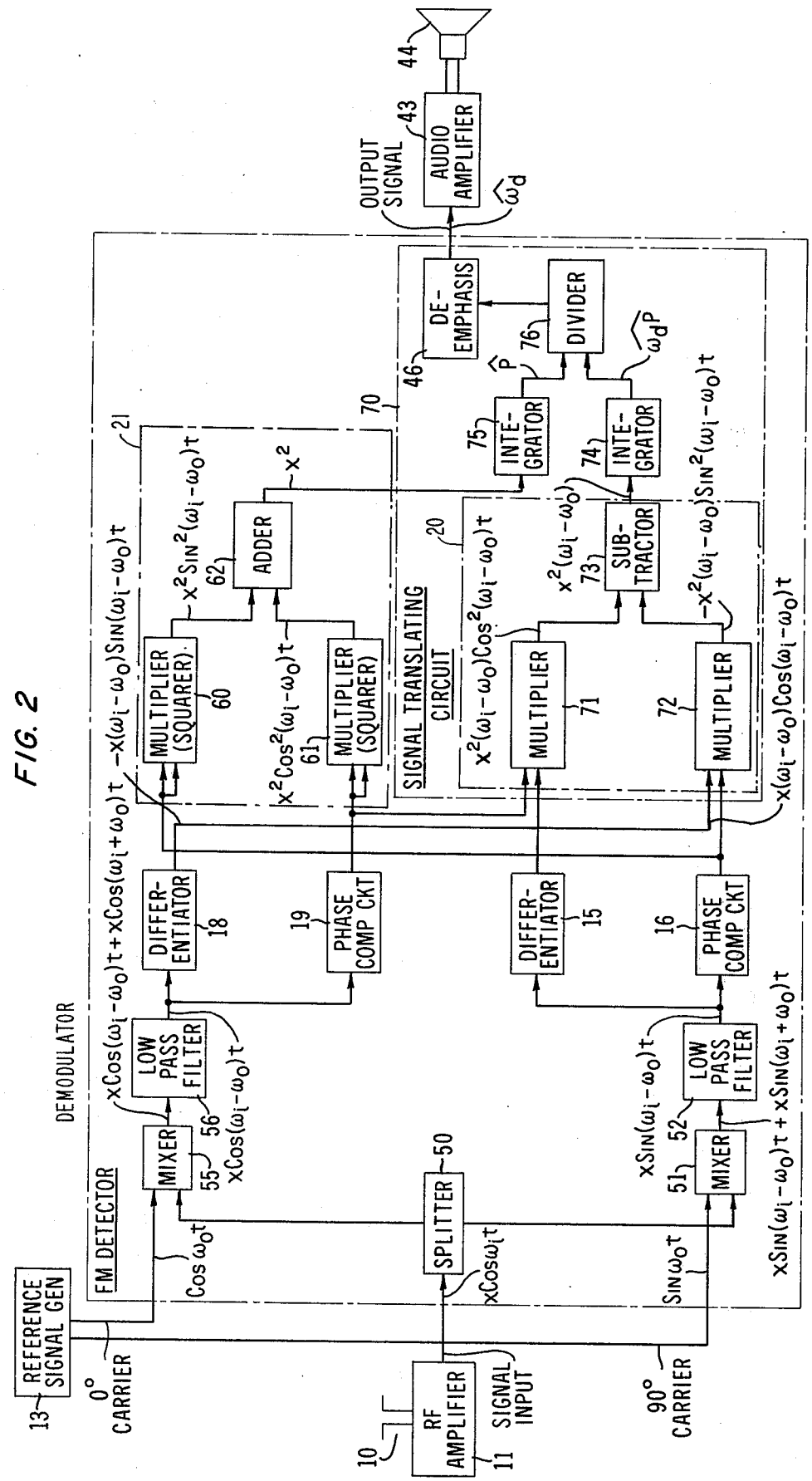
FIG. 2 depicts a more detailed block diagram of a receiver circuit according to this invention and having the signals present at each stage labeled thereon.

One illustrative AM/FM receiver circuit according to this invention is shown in FIG. 2 as a circuit for generating an acoustic signal corresponding to the audio component of a radio frequency signal received on the antenna 10. An input signal received on antenna 10 is represented as a sinusoidal signal of the form $x \cos \omega_i t$ where $x$ is the amplitude of the input signal, $\omega_i$ is the instantaneous frequency of the input signal in radians per second, i.e., $\omega = 2\pi f$ where $f$ is the frequency in hertz and $t$ represents the time varying nature of the input signal. The output of antenna 10 is connected to an RF amplifier 11 which amplifies the received RF signal in order to drive the remaining circuits.

The output of RF amplifier 11 is connected to the input of a splitter network 50 which presents two output signals of the same form as the signal applied to its input. The reference signal generator 13 comprises an oscillator which has two outputs for presenting signals corresponding respectively to $\sin \omega_o t$ and $\cos \omega_o t$ where $\omega_o$ is a reference frequency which is the center frequency at which the receiver receives input signals.

An output of splitter circuit 50 and the output of reference signal generator 13, corresponding to $\sin \omega_o t$, are connected to respective inputs of mixer circuit 51. An exemplary mixer circuit such as is contemplated for use in this invention comprises an analog multiplier circuit having two inputs, an output, and means for generating at the output a signal corresponding to the mathematical product of the two numbers represented by the signals present at the inputs. The product of the two signals applied to mixer 51, $x \cos \omega_i t$ and $\sin \omega_o t$, is a signal having components representing both the sum and difference of the two frequencies as follows:

$$x \sin (\omega_i - \omega_o)t + x \sin (\omega_i + \omega_o)t \qquad (1)$$

The output of mixer 51 is connected to the input of a low pass filter 52 whose bandpass characteristic is arranged such that the signal component corresponding to the sum of $\omega_i$ and $\omega_o$ is removed, leaving $$x \sin (\omega_i - \omega_o)t \qquad (2)$$

A low pass filter comprises an input for receiving an input signal and an output for providing a signal corresponding to only those components of the input signal having a frequency less than a certain cutoff frequency. Low pass filter 52, in addition to removing the signal corresponding to the sum of the two frequencies $\omega_i$ and $\omega_o$, is also designed to perform the function of an Intermediate Frequency (IF) amplifier, namely to filter out all signals outside the range of frequencies corresponding to the bandwidth of the desired signal and thereby removing signals adjacent to the desired signal. The output of low pass filter 52 is connected to the input of a differentiator circuit 15 which generates a signal at its output corresponding to the first derivative of the input signal (2) which is $$x (\omega_i - \omega_o) \text{Cos} (\omega_i - \omega_o)t \qquad (3)$$

A differentiator circuit may be constructed from a low pass filter circuit having certain predefined characteristics. The output of low pass filter 52 is also connected to an input of phase compensation circuit 16. A phase compensation circuit such as is contemplated for use in this invention comprises, for example, a low pass filter having predefined characteristics such that its output is phase shifted whereby the phase difference between the outputs of differentiator 15 and phase compensation circuit 16 are constant over a range of frequencies.

The output of reference signal generator 13, corresponding to Cos $\omega_o t$, is connected to a first input of a mixer circuit 55, and an output of splitter circuit 50 is connected to a second input of mixer circuit 55. The output of mixer circuit 55 is the product of the two input signals, $x$ Cos $\omega_i t$ and Cos $\omega_o t$, which is:

$$x \text{ Cos } (\omega_i - \omega_o)t + x \text{ Cos } (\omega_i + \omega_o)t \qquad (4)$$

The output of mixer 55 is connected to the input of a low pass filter 56 whose bandpass characteristic is arranged such that the signal component corresponding to the sum of $\omega_i$ and $\omega_o$ in (4) is removed, leaving $$x \text{ Cos } (\omega_i - \omega_o)t \qquad (5)$$

The output of low pass filter 56 is connected to the input of a differentiator circuit 18 which generates at its output a signal corresponding to the first derivative of the input signal (5), which is $$x (\omega_i - \omega_o) \text{ Sin } (\omega_i - \omega_o)t \qquad (6)$$

Low pass filter 56, in addition to the above mentioned function, also performs the IF amplifier and filter function as described for low pass filter 52. The output of low pass filter 56 is also connected to an input of phase compensation circuit 19 which generates at its output a signal having a constant phase difference with respect to the signal present at the output of differentiator 18 over a range of frequencies.

The output of phase compensation circuit 16 is connected to both inputs of a multiplier circuit 60 which is, therefore, used as a mathematical squarer. The signal present at the output of multiplier circuit 60 corresponds to the input signal (2) squared, as follows:

$$x^2 \text{ Sin}^2 (\omega_i - \omega_o)t \qquad (7)$$

The output of phase compensation circuit 19 is connected to both inputs of a multiplier 61 which is therefore used as a mathematical squarer. The signal present at the output of multiplier circuit 61 corresponds to the input signal (5) squared, as follows:

$$x^2 \text{ Cos}^2 (\omega_i - \omega_o)t \qquad (8)$$

The output of multiplier circuit 60 is connected to a first input of an adder circuit 62 and the output of multiplier circuit 61 is connected to a second input of adder circuit 62. Adder circuit 62 comprises, for example, an output and means for generating at that output a signal corresponding to the mathematical sum of the numbers represented by the input signal. The output of adder circuit 62 corresponds to $$x^2 = x^2 (\text{Cos}^2 (\omega_i - \omega_o)t + \text{Sin}^2 (\omega_i - \omega_o)t)$$

A signal translating circuit 70 comprises inputs connected to the output of adder 62 and optionally to the outputs of differentiators 15 and 18 and phase compensation circuits 16 and 19, an output and means for generating at that output a signal corresponding to the audio component of the input signal received by antenna 10. One of three different circuits may be used to implement signal translating circuit 70 according to the type of modulation of the input signal received by antenna 10 and the transmission characteristics. A first signal translating circuit for demodulating the input signal received by antenna 10 by generating an estimate of the power mean frequency of the input signal is shown in FIG. 2.

An output of differentiator 15 is connected to one input of a multiplier 71, and the output of phase compensation circuit 19 is connected to another input of multipler 71 which generates at its output a signal corresponding to the product of the two input signals, as follows:

$$x^2 (\omega_i - \omega_o) \text{Cos}^2 (\omega_i - \omega_o)t \qquad (9)$$

The output of differentiator 18 is connected to one input of a multiplier 72 and the output of phase compensation circuit 16 is connected to the other input of multiplier 72 which generates an output signal corresponding to the product of the input signals, as follows:

$$-x^2 (\omega_i - \omega_o) \text{Sin}^2 (\omega_i - \omega_o)t \qquad (10)$$

The output of multiplier 71 is connected to the minuend input of subtractor circuit 73, and the output of multiplier 72 is connected to the subtrahend input of subtractor 73. The output of subtractor 73 represents a number which corresponds to the difference between the numbers represented by the signals present on the minuend input and the subtrahend input, as follows:

$$x^2 (\omega_i - \omega_o) \qquad (11)$$

The output of subtractor circuit 73 is connected to the input of an integrator circuit 74 which generates at its output a signal corresponding to the time average of its input signal over a predefined period of time. The output of adder 62 is connected to the input of an integrator 75. The output of integrator 74 is connected to the dividend input of a divider circuit 76, and the output of integrator circuit 75 is connected to the divisor input of divider circuit 76. The output of divider circuit 76 represents a number corresponding to the number represented by the signal present on the dividend input divided by the number represented by the signal present on the divisor input. The output of divider circuit 76 represents the power mean frequency of the input signal received by antenna 10 which corresponds to the audio component of the frequency modulated input signal. The output of divider circuit 76 is connected to the input of a de-emphasis circuit 46. The output of de-emphasis circuit 46, which is also the output of signal translating circuit 70, is connected to the input of an audio amplifier 43 which generates at its output a signal of sufficient amplitude to drive an acoustic signal generating means 44.

Figure 3:
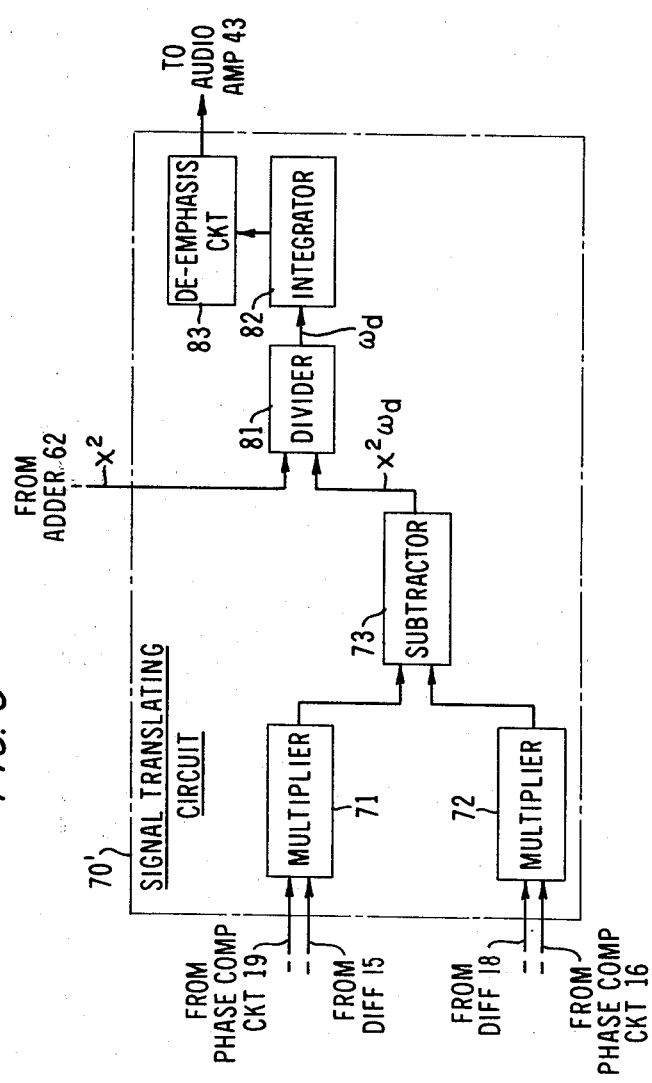
Figure 5:
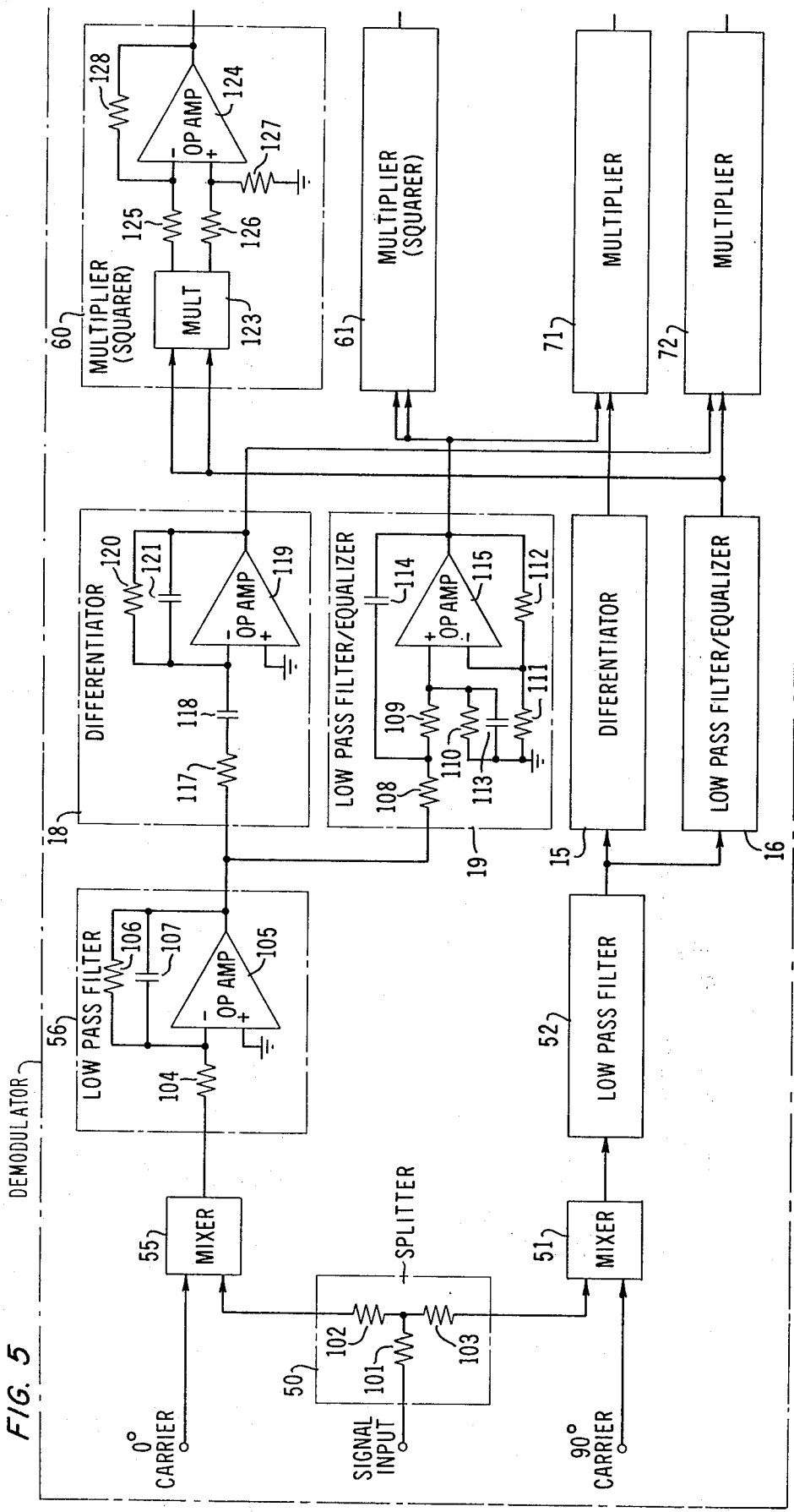

A signal translating circuit is shown in FIG. 3 for generating a signal corresponding to the instantaneous frequency of the input signal present at antenna 10. The instantaneous frequency also corresponds to the audio component of a frequency modulated signal. The instantaneous frequency and the power mean frequency each have advantages under certain input signal conditions. Multipliers 71 and 72 and subtractor 73 are connected in FIG. 3 in the same manner as in FIG. 2. The output of subtractor 73 is connected to the dividend input of divider circuit 81, and the output of adder circuit 62 is connected to the divisor input of divider circuit 81. The output of divider circuit 81, which corresponds to the instantaneous frequency of the input signal present at antenna 10, is connected to the input of an integrator circuit 82 which generates at its output a signal corresponding to the time average of the signal present on its input. The output of integrator circuit 82 is connected to the input of a de-emphasis circuit 83. The output of de-emphasis circuit 83 is also the output of signal translating circuit 70 and is, therefore, connected to the input of audio amplifier 43.

Figure 4:
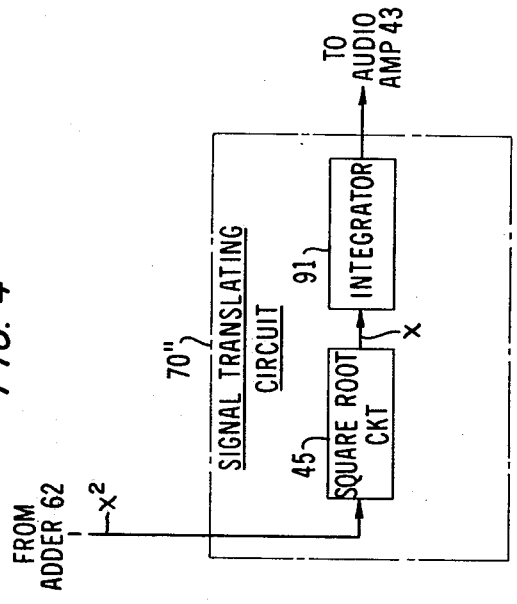
FIG. 3 and 4 depict alternative signal translating circuits for use in the circuit of FIG. 2.

A signal translating circuit for generating a signal corresponding to the amplitude of the signal present at antenna 10 is shown in FIG. 4. The output of adder circuit 62 is connected to the input of a square root circuit 45 which generates at its output a signal representing the mathematical square root of the number represented by its input signal. The output of square root circuit 45 coresonds to the instantaneous amplitude of the input signal present at antenna 10. The output of square root circuit 45 is connected to integrator circuit 91 which generates at its output a signal corresponding to the time average of its input signal over a predefined period of time. The output of integrator circuit 91 is also the output of the signal translating circuit 70 and represents the audio component of an AM signal present at antenna 10. The output of integrator circuit 91 is, therefore, connected to the input of audio amplifier 43. An alternate signal translating circuit for generating a signal corresponding to the amplitude of the signal present at antenna 10 comprises the series connection of an integrator circuit, a square root circuit, and a low pass filter circuit. The output of the low pass filter circuit would be connected to audio amplifier 43.

One exemplary implementation of an FM detector utilizing a signal translating circuit which provides at its output a signal corresponding to the power mean frequency of the received FM signal is shown in FIG. 7. The implementation shown in FIG. 7 utilizes well known elements, for example, resistors, capacitors, operational amplifiers, mixers, and multipliers. Each functional block in FIG. 7 corresponds to a functional block shown in FIG. 2 and the implementation of each of these blocks using the above-mentioned elements is also well known in the art and is included here merely as an exemplary implementation.

A splitter circuit 50 comprises three resistors, 101, 102, and 103, connected in a Y arrangement in order to split the input signal into two branches, each of which corresponds to the input signal. Mixers 51 and 55 are commercially available blocks which perform the function of mixing two input signals to provide an output signal having frequency components equal to both the sum and the difference of the input frequency components. Low pass filter 56 comprises an input resistor 104 connected from the filter input to the negative input of operational amplifier (op amp) 105, a ground connection to the positive input of op amp 105, and RC network comprising in parallel resistor 106 and capacitor 107 is connected in a feedback path between the output of op amp 105 and its negative input. The output of op amp 105 comprises the low pass filter output. The circuit shown as low pass filter 56 is a so-called active filter whose characteristics are determined by the values of resistors 104 and 106 and capacitor 107. Low pass filter 52 comprises a similar circuit.

Phase compensator 19 which is basically a low pass filter comprises a second order active filter which is the equivalent of two first order active filters such as used to implement low pass filter 56 in series. The phase compensator 19 comprises resistors 108, 109, 110, 111, and 112, capacitors 113 and 114 and op amp 115 connected as shown in FIG. 2. Phase compensator 16 comprises a similar circuit.

Differentiator circuit 18 comprises a resistor 117 and a capacitor 118 connected in series between the differentiator input and the negative input of op amp 119. The positive input of op amp 119 is connected to ground and a parallel RC network comprising a resistor 120 and a capacitor 121 is connected in the feedback path between the output of op amp 119 and its negative input. The output of op amp 119 comprises the output of differentiator 18. The characteristics of differentiator circuit 18 are determined by the values of the resistors and capacitors as shown. Differentiator circuit 15 comprises a similar circuit. An ideal differentiator circuit would not require resistor 117 and capacitor 121. However, it is desirable to reduce the gain of op amp 119 above the highest frequency of interest rather than allowing it to continuously increase in an ideal fashion. Resistor 117 and capacitor 121 perform this function of gain reduction above the highest frequency of interest.

A multiplier circuit 60 comprises a commercially available multiplier 123 having its inputs connected to the inputs of multiplier circuit 60 and an op amp 124 which provides an appropriate gain in signal strength. The outputs of multiplier circuit 123 are connected to the corresponding inputs of op amp 124 by resistors 125 and 126. A resistor 127 is connected from the positive input of op amp 124 to ground and a resistor 128 is connected in the feedback path between the output of op amp 124 and its negative input. The output of op amp 124 comprises the output of multiplier 60. Multiplier circuit 61 comprises a similar circuit and both multiplier circuits 60 and 61 are utilized to perform a mathematical squarer function by connecting both inputs to an input signal representing a number to be squared. Multiplier circuits 71 and 72 comprise similar circuits used to perform mathematical multiplication.

An adder circuit 62 comprises resistors 130 and 131 connected between respective inputs of adder circuit 62 and the negative input of an op amp 132. Op amp 132 has its positive input connected to ground and a resistor 133 connected in a feedback path between the output and the negative input of op amp 132. The output of op amp 132 comprises the output of adder circuit 162.

A subtractor circuit 73 comprises a resistor 135 connected between the subtrahend input of subtractor circuit 73 and the negative input of an op amp 136, a resistor 137 connected between the minuend input of subtractor circuit 73 and the positive input of op amp 136, a resistor 138 connected between the positive input of op amp 136 and ground, and a resistor 139 connected in a feedback path between the output of op amp 136 and its negative input. The output of op amp 136 comprises the output of subtractor circuit 73.

An integrator circuit 75 comprises a resistor 141 connected between the input of integrator 75 and the negative input of an op amp 142, and RC network comprising resistor 143 and capacitor 144 in parallel is connected in a feedback path between the output of op amp 142 and its negative input and a connection between the positive input of op amp 142 and ground. The output of op amp 142 comprises the output of integrator circuit 75. Integrator circuit 74 comprises a similar circuit. It should be noted that integrator circuit 75 and low pass filter circuit 56 are identical in terms of the components and their interconnection; however, the values of those components will be determined according to different requirements in order to perform the indicated function. An ideal integrator circuit which would perform an integration or averaging function over all time up to the present would not require a resistor 143. However, the integrators 74 and 75 are designed to be lossy integrators, i.e., their output represents integration only over a predetermined prior time interval and the effect of inputs before that predetermined time interval will be dissipated by resistor 143.

The divider circuit 76 comprises a multiplier circuit 146 with one input connected to the divisor input of divider circuit 76 and the other input connected to the output of op amp 147 in a feedback path. The output of multiplier 146 is connected through a resistor 148 to the negative input of op amp 147. The divident input of divider circuit 76 is also connected to the negative input of op amp 147 through a resistor 149. The positive input of op amp 147 is connected to ground and its output comprises the output of divider circuit 76.

What has been described is considered to be only a specific illustrative embodiment of the invention and it is to be understood that various other arrangements may be devised by one skilled in the art without departing from the spirit and scope thereof as defined by the accompanying claims.

What is claimed is:

1. A receiver for producing signals corresponding to the modulating signals of applied frequency modulated and amplitude modulated radio frequency signals comprising:
    an antenna;
    radio frequency amplification means comprising:
        an input connected to said antenna;
        an output terminal; and
        means for generating a signal at said output terminal corresponding to a signal present at said input amplified by a predefined factor; and
    a demodulation circuit comprising:
        an input;
        an output;
        switch means comprising:
            a first input;
            a second input;
            a third input;
            an output connected to said demodulation circuit output; and
            means for selectively connecting one of said first, second, and third inputs of said switch means to said switch means output; and
        demodulation means for generating: at said switch means first input a signal corresponding to the instantaneous amplitude of an input signal applied to said receiver antenna utilizing: a first circuit for generating a first signal corresponding to the instantaneous power of said applied signal, a circuit for generating a signal corresponding to the square root of said first signal, and a first integrator circuit for integrating said square root signal, said integrated square root signal being applied to said switch means first input; at said switch means second input a signal corresponding to the instantaneous frequency of an input signal applied to said receiver antenna utilizing: said first circuit and a second circuit for generating signals corresponding respectively to the instantaneous power and instantaneous power frequency product of said applied signal, a divider circuit for providing a signal corresponding to the ratio of said instantaneous power frequency product signal to said instantaneous power signal, and a second integrator circuit for integrating said ratio signal, said integrated ratio signal being applied to said switch means second input; and at said switch means third input a signall corresponding to an estimate of the power mean frequency of said applied signal utilizing: said first and second circuits for generating said instantaneous power and said instantaneous power frequency product signals, said first and second integrator circuits for integrating said instantaneous power and said instantaneous power frequency product signals and a divider circuit for providing said estimate of said power mean frequency signal corresponding to the ratio of said integrated power frequency product signal to said integrated instantaneous power signal, said estimate of said power means frequency signal being applied to said switch means third input.

2. A receiver for producing signals corresponding to the modulating signals of applied frequency modulated radio frequency signals comprising:
    an antenna;
    radio frequency amplification means comprising:
        an input connected to said antenna;
        an output terminal; and
        means for generating a signal at said last mentioned output terminal corresponding to a signal present at said input amplified by a predefined factor; and
    a demodulation circuit comprising:
        an input;
        an output;
        and means for generating at said demodulation circuit output a signal corresponding to an estimate of the power mean frequency of said applied signal utilizing: a circuit for generating a signal corresponding to the instantaneous power of said applied signal and a circuit for generating a signal corresponding to the instantaneous power frequency product of said applied signal, first and second integrator circuits for integrating said instantaneous power and said instantaneous power frequency product signals and a diviider circuit for providing said estimate of said power mean frequency signal corresponding to the ratio of said integrated power frequency product signal to said integrated instantaneous power signal.

3. A receiver for producing signals corresponding to the modulating signals of applied frequency modulated radio frequency signals comprising:
    an antenna;
    radio frequency amplification means comprising:
        an input connected to said antenna;
        an output terminal; and means for generating a signal at said last mentioned output terminal corresponding to a signal present at said input amplified by a predefined factor; and a demodulation circuit comprising:
an input;
an output;
and means for generating at said demodulation circuit output a signal corresponding to the instantaneous frequency of an input signal applied to said receiver antenna utilizing: first and second circuits for generating signals corresponding respectively to the instantaneous power and instantaneous power frequency product of said applied signal, a divider circuit for providing a signal corresponding to the ratio of said instantaneous power frequency product signal to said instantaneous power signal, and an integrator circuit for integrating said ratio signal.

4. A receiver for producing signals corresponding to the modulating signals of applied amplitude modulated radio frequency signals comprising:
an antenna;
radio frequency amplification means comprising:
an input connected to said antenna;
an output terminal; and
means for generating a signal at said last mentioned output terminal corresponding to a signal present at said input amplified by a predefined factor; and a demodulation circuit comprising:
an input;
an output;
and means for generating at said demodulation circuit output a signal corresponding to the instantaneous power of an input signal applied to said receiver antenna utilizing: a circuit for generating a first signal corresponding to the instantaneous power of said applied signal, a circuit for generating a signal corresponding to the square root of said first signal, and an integrator circuit for integrating said square root signal.

5. A spectral parameter estimator for use as a demodulator comprising:
a spectral parameter estimator input terminal for receiving an input signal;
a spectral parameter estimator output terminal;
a reference signal generator comprising:
a first output;
a second output; and
means for generating signals at said first and second outputs corresponding to the Sine and Cosine, respectively, of a reference signal frequency times a time factor;
a first mixer comprising:
a first input connected to said input terminal;
a second input connected to said first output of said reference signal generator;
an output; and
means for generating an output signal corresponding to the Sine of the difference between said input signal frequency and said reference signal frequency plus the Sine of the sum of said input signal frequency and said reference signal frequency;
a first low pass filter comprising:
an input connected to said output of said first mixer;
an output; aand
means for generating on said output a signal corresponding to the Sine of said input signal frequency minus said reference signal frequency;
a second mixer comprising:
a first input connected to said input terminal;
a second input connected to said second output of said reference signal generator;
an output; and
means for generating an output signal corresponding to the Cosine of the difference between said input signal frequency and said reference signal frequency plus the Cosine of the sum of said input signal frequency and said reference signal frequency;
a second low pass filter comprising:
an input connected to said output of said second mixer;
an output; and
means for generating on said output a signal corresponding to the Cosine of said input signal frequency minus said reference signal frequency;
a first differentiator circuit comprising:
an input connected to said output of said first low pass filter circuit;
an output; and
means for generating an output signal corresponding to the derivative of the signal applied to said input of said first differentiator circuit;
a second differentiator circuit comprising:
an input connected to said output of said second low pass filter circuit;
an output; and
means for generating an output signal corresponding to the derivative of the signal applied to said input of said second differentiator circuit;
a power circuit comprising:
first and second inputs connected respectively to said first low pass filter circuit and said second low pass filter circuit;
an output; and
means for generating an output signal corresponding to the power of an input signal applied to said spectral parameter estimator input terminal;
a signal translating circuit comprising:
inputs connected to said outputs of said first and second low pass filter circuits, said first and second differentiator circuits, and said power circuit;
an output connected to said spectral parameter estimator output terminal; and
means for generating a signal at said output corresponding to the demodulated audio component of an input signal applied to said spectral parameter estimator input as represented by said inputs to said signl translating circuit.

6. A spectral parameter estimator according to claim 5 wherein said signal translating circuit further comprises:
a power frequency product circuit comprising:
inputs connected to said outputs of said first and second low pass filter circuits and said first and second differentiator circuits;
an output; and
means for generating an output signal corresponding to the product of the power of said input signal and the difference between said input signal frequency and said reference signal frequency;
a first integrator comprising:
an input connected to said output of said power frequency product circuit;
an output; aand
means for generating an output signal corresponding to the average power frequency product of said input signal and said reference signal over a predetermined period of time;
a second integrator circuit comprising:
an input connected to said output of said power circuit;
an output; and
means for generating an output signal corresponding to the average power of said input signal;
a divider circuit comprising:
a dividend input connected to said output of said first integrator;
a divisor input connected to said output of said second integrator;
an output connected to said output terminal; and
means for generating an output signal corresponding to the power mean frequency of said input signal.

7. A spectral parameter estimator according to claim 5 wherein said signal translating circuit further comprises:
a power frequency product circuit comprising:
inputs connected to said outputs of said first and second low pass filter circuits and said first and second differentiator circuits;
an output; and
means for generating an output signal corresponding to the product of the power of said input signal and the difference between said input signal frequency and said reference signal frequency;
a divider circuit comprising:
a dividend input connected to said output of said power frequency product circuit;
a divisor input connected to said output of said power circuit;
an output; and
means for generating an output signal corresponding to the instantaneous frequency of said input signal;
an integrator circuit comprising:
an input connected to said output of said divider circuit;
an output connected to said output terminal; and
means for generating an output signal corresponding to the average instantaneous frequency over a predetermined period of time.

8. A spectral parameter estimator according to claim 5 wherein said signal translating circuit further comprises:
a square root circuit comprising:
an input connected to said output of said power circuit;
an output; and
means for generating an output signal corresponding to the mathematical square root of the nmber represented by said input signal;
an integrator circuit comprising:
an input connected to said output of said square root circuit;
an output connected to said output terminal; and
means for generating an output signal corresponding to the average amplitude of said input signal over a predetermined period of time.

9. A spectral parameter estimator according to claim 5 further comprising:
a splitter circuit connected between said input terminal and said first mixer circuit and said second mixer circuit comprising:
an input connected to said input terminal;
a first output;
a second output; and
means for generating at said first and said second outputs signals corresponding to signals present on said splitter circuit input.

10. A spectral parameter estimator according to claim 6 further comprising:
a first phase compensation circuit connected between said first low pass filter output and said power circuit comprising:
an input connected to said output of said first low pass filter;
an output connected to an input of said power circuit; and
means for generating a signal at said first phase compensation circuit output corresponding to the signal present at said first phase compensation circuit input phase shifted whereby said output of said first differentiator and said output of said first phase compensation circuit have a substantially constant phase relationship over a certain range of frequencies; and
a second phase compensation circuit connected between said second low pass filter output and said power circuit comprising:
an input connected to said output of said second low pass filter;
an output connected to an input of said power circuit; and
means for generating a signal at said second phase compensation circuit output corresponding to the signal present at said second phase compensation circuit input phase shifted whereby said output of said second differentiator and said output of said second phase compensation circuit input phase shifted whereby said output of said second differentiator and said output of said second phase compensation circuit have a substantially constant phase relationship over a certain range of frequencies.

11. A spectral parameter estimator according to claim 5 wherein said signal translating circuit further comprises:
an integrator circuit comprising:
an input connected to said output of said power circuit;
an output; and
means for generating an output signal corresponding to the time average of a signal present at said integrator input;
a square root circuit comprising:
an input connected to said output of said integrator circuit;
an output; and
means for generating an output signal corresponding to the mathematical square root of the number represented by the signal present at said square root circuit input;
a low pass filter circuit comprising:
an input connected to said output of said square root circuit;
an output connected to said output terminal; and
means for generating an output signal corresponding to certain low frequency components of the signal present on said low pass filter input.

* * * * *

UNITED STATES PATENT AND TRADEMARK OFFICE
CERTIFICATE OF CORRECTION

PATENT NO. : 3,971,988
DATED : July 27, 1976
INVENTOR(S) : Jeffrey N. Denenberg

It is certified that error appears in the above-identified patent and that said Letters Patent are hereby corrected as shown below:

Column 10, Claim 1, line 17 delete "signall" and insert --signal; line 30 delete "means" and insert --mean--. Column 10, Claim 2, line 57 delete "diviider" and insert --divider--. Column 12, Claim 5, line 1, delete "aand" and insert --and--. Column 13, Claim 6, line 6, delete "aand" and insert --and--. Column 13, Claim 8, line 60, delete "nmber" and insert --number--.

Signed and Sealed this

First Day of July 1980

[SEAL]

Attest:

SIDNEY A. DIAMOND

Attesting Officer　　　Commissioner of Patents and Trademarks